(12) United States Patent
Ban et al.

(10) Patent No.: US 6,469,931 B1
(45) Date of Patent: Oct. 22, 2002

(54) METHOD FOR INCREASING INFORMATION CONTENT IN A COMPUTER MEMORY

(75) Inventors: Amir Ban, Ramat Hasharon (IL); Simon Litsyn, Givat Shmuel (IL); Idan Alrod, Tel Aviv (IL)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 0 days.

(21) Appl. No.: 09/895,398

(22) Filed: Jul. 2, 2001

Related U.S. Application Data

(60) Provisional application No. 60/259,589, filed on Jan. 4, 2001.

(51) Int. Cl.[7] ................................................ G11C 14/00
(52) U.S. Cl. ............................. 365/185.08; 365/185.33
(58) Field of Search ........................ 365/185.08, 185.33, 365/82, 186, 187, 188

(56) References Cited

U.S. PATENT DOCUMENTS 4,351,013 A * 9/1982 Matsko et al. ........... 342/158.1
5,991,725 A * 11/1999 Asghar et al. .............. 704/201

* cited by examiner

Primary Examiner—David Nelms
Assistant Examiner—Thong Le
(74) Attorney, Agent, or Firm—Mark M. Friedman

(57) ABSTRACT

A method for increasing information capacity in nominally m-bit-per-cell Flash technology, using advanced coding techniques and changes in the Flash array interface, without increasing the basic cell size or the bit read failure rate. The increase in information capacity is obtained by using a number n, greater than 1, of memory cells, each cell having a respective adjustable parameter, setting the parameters to collectively represent a binary number of b bits, b being greater than nm, measuring the parameters and decoding the measured parameters collectively to recover the number.

20 Claims, 1 Drawing Sheet

METHOD FOR INCREASING INFORMATION CONTENT IN A COMPUTER MEMORY

This application claims the benefit of provisional application No. 60/259,589, filed Jan. 4, 2001.

FIELD AND BACKGROUND OF THE INVENTION

The present invention relates to a method of storing information in a computer memory, specifically Flash memory. Flash memory consists of large arrays of cells that represent digital information. Typically, each cell represents one bit of data. Some types of Flash cells using Multi-Level Cell (MLC) technology are able to represent more than one bit in a single cell.

In the physical world, each cell carries in fact a voltage level derived from a continuous spectrum, the spectrum called the "voltage window". The voltage levels are divided into non-overlapping bands, each representing a digital value. In single-bit-per-cell Flash there are two such bands, one representing the "0" bit value, the other the "1" bit value. In MLC Flash with m bits per cell, there are $2^m$ non-overlapping bands, one for each possible value of the m bits. This existing Flash technology is referred to hereinafter as "nominal m-bit-per-cell Flash technology".

Increasing the information content of Flash cells is a central goal of Flash memory design. Such an increase will result in lower cost per Megabyte of memory and increased bit density, resulting in smaller area, smaller power dissipation and higher production yields.

Much effort has been invested in MLC technology, and 2 bits-per-cell Flash devices are now available commercially. The limiting factor is the number of non-overlapping voltage bands that can be placed in the voltage window, where 2 bits per cell need 4 bands, and 3 bits per cell need 8 bands. The voltage window cannot be increased in size beyond some limit, while each of the voltage bands has a finite width that is dictated by several facts of Flash technology:

- The precision of the read and program circuits of the cell voltage level is finite and limited by random noise that is inherent in all such circuitry.
- The number of program/erase cycles in Flash is limited, due to effects of wear. These effects include the shrinkage of the voltage window, and the introduction of a bias in each of the voltage bands. Consequently, the MLC capability of Flash is reduced with wear.
- Flash cells lose their programmed voltage slowly when not programmed for a long time. Therefore, to avoid misreading a cell with an incorrect value, the voltage bands must be far apart enough to avoid a cell voltage drifting into the wrong band. This effect places a time limit on the data retention of Flash cells.

To achieve higher MLC capability, researchers have sought ways to control these noise and bias effects. Harari et al. in U.S. Pat. No. 5,163,041 introduced the device of reference cells, where extra Flash cells are attached to a group of Flash cells, and programmed with the voltage level of each bit representation. Cell values are read in comparison with the level of reference cells, rather than in comparison with any fixed value. Since the reference cells undergo the same programming history as the data cells they are attached to, they serve to cancel most of the systematic bias caused by wear and voltage loss, but cannot solve the inherent signal-to-noise reduction caused by these effects.

It should be noted that a voltage band does not have a clear-cut edge. In fact, there is a statistical distribution of likely voltages around its center, and the width of the band is a statistical measure of that distribution. The bands are non-overlapping only up to a certain probability, and they in fact overlap to a small degree that may produce a bit read failure (BRF). The voltage bands are designed with some constrains, i.e. to produce a nominal bit read failure rate (BRFR) smaller than some target (for example $10^{-13}$), given a target of some program/erase cycling endurance (for example 100,000), and some minimal data retention period (for example 10 years). As used hereinafter, "nominal BRF" and/or "nominal BRFR" refer to existing Flash, and more generally, to existing solid state memory BRF or BRFR characteristics. These given constraints set the limit for the MLC capability of the Flash technology. While greater multi-bit capability could be achieved by relaxing these target specifications (i.e. relaxing the nominal BRFR), such relaxation does not truly increase the information content of the Flash cells.

There is thus a widely recognized need for, and it would be highly advantageous to have, a method by which the information content can be truly increased in both single-bit-per-cell and multi-level cell Flash technology. This increase in information content would result in reduced cost per megabyte of memory, or, alternatively, for a given memory size, in lower dissipative power loss and lower manufacturing cost, among other advantages.

SUMMARY OF THE INVENTION

The present invention presents a method by which the information content can be truly increased in both single-bit-per-cell and multi-level cell Flash technology, as well as in other memories.

According to the present invention there is provided a method for storing and retrieving a binary number including b data bits, comprising the steps of: a) providing a memory including a number n, greater than 1, of cells, each cell having a respective adjustable parameter; and b) setting the parameters to collectively represent the number.

According to a preferred embodiment of the method of the present invention, the method further comprises the steps of: c) measuring the parameters; and d) decoding the measured parameters collectively to recover the number.

According to the present invention there is provided a method for storing and retrieving a binary number including b data bits in a nominal m-bit per cell memory technology having a nominal bit read failure rate, m being at least 1, the method comprising the steps of: a) providing a plurality n<b/m of cells; b) assigning each cell at least $2^m+1$ adjustable parameter values; and c) setting the parameter values to collectively represent the number, whereby the nominal bit read failure rate is preserved.

According to a preferred embodiment of the method of the present invention, the method further comprises the steps of: d) measuring the parameter values; and e) collectively decoding the measured parameter values to recover the number.

According to the present invention there is provided a storage device for storing a binary number of b bits, the device comprising: a) a memory having a plurality n of nominal m-bit-per cell cells, n being smaller than b/m; b) a plurality of adjustable parameters used to represent the bits; c) storing means to collectively set the adjustable parameters to store the number in the memory; and d) retrieving means to collectively measure the parameters to retrieve the number from the memory.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for increasing the storage capacity of computer memories. Specifically, the present invention can be used to truly increase the information content in both single-bit-per-cell and multi-level cell Flash technology memories without increasing their nominal BRFR. However, although the description deals almost exclusively with Flash memories, the invention is equally applicable to other memories that fulfill criteria listed later in this specification.

The principles and operation of a method to increase the information content in both single-bit-per-cell and multi-level cell Flash memories according to the present invention, may be better understood with reference to the drawings and the accompanying description.

A key aspect of the present invention is its manipulation and use of the collective data information content of a group of neighboring cells, rather than the content of a single cell. The information is processed in groups of data bits. Each group is encoded using a suitable encoding algorithm into voltage levels for each of a group of several neighboring Flash cells, and the information is recorded by programming these voltage levels into the Flash cell group. To retrieve the data, the voltage levels of the Flash cell group are read, and through a suitable decoding mechanism are transformed back to data bits. The collective use of a number of cells together for encoding and decoding of data is an essential feature of the method of the present invention As a rule, the number of voltage levels that the collective coding translates to is larger than the number of voltage bands that may be put in a single cell using the normal constraints of MLC technology. For example, for single-bit-per-cell technology this method is able to store more than two levels. When considering one cell at a time, it would not be possible to actually distinguish between all the levels (unless a larger nominal BRF is tolerated), so there is overloading of the cell information capacity. It is only by considering collectively a group of cells at a time and by using a coding scheme, that the cell group's information can be retrieved reliably and with a net increase in the quantity of this information.

Sphere Packing

As mentioned above, in a single Flash cell, there are several non-overlapping voltage bands each of width d, in a voltage window of size $V_{max}$. The center of each voltage band represents the programmed voltage for a bit value (in single-bit-per-cell) or for several bit values (in multi-level cell). We define a band radius r as half the minimum voltage distance between two centers, so that the inter-center voltage distance is at least 2r=d.

Figure 1:
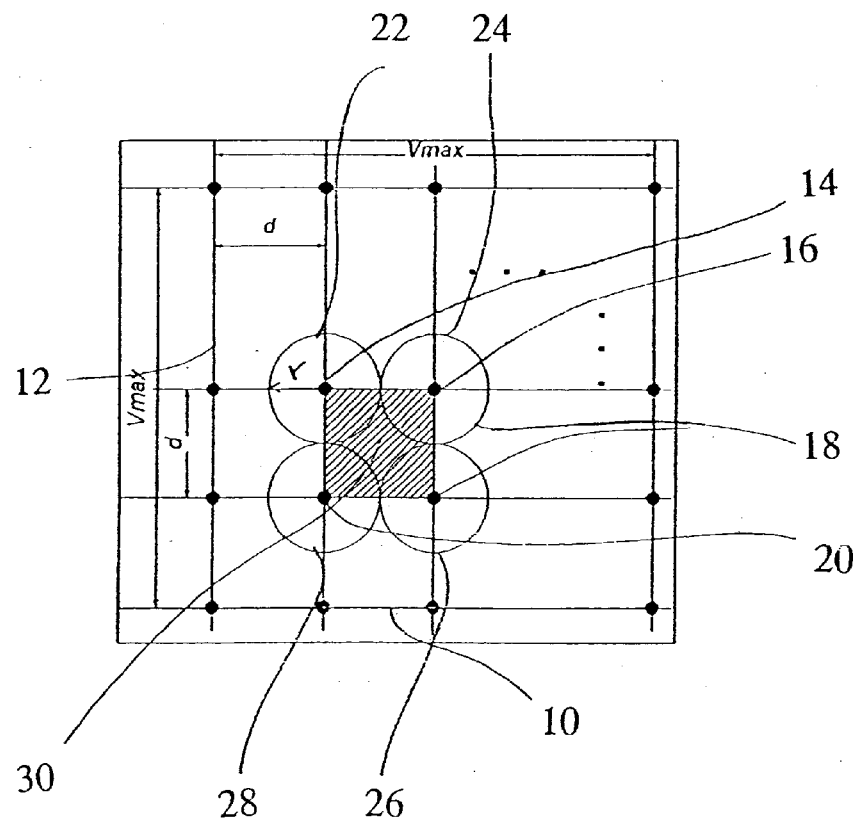
FIG. 1 is a schematic description of a single dimension equivalent encoding in a two dimensional plane.

Referring now to the drawings, FIG. 1 illustrates schematically a single dimension equivalent encoding in a two dimensional plane. Considering now two neighboring cells at a time, we can plot voltages 10 of the first cell as points on the X axis and voltages 12 of the second cell as points on the Y axis, in which case the voltage windows of both cells define a voltage square in the XY plane.

If we plot all possible data (voltage) values of both cells, we see that they lie on a rectangular grid where data values or "points", e.g. points 14, 16, 18 and 20 are each represented by an X-Y voltage band center pair. Obviously, the shortest plane distance between two such points is at least 2r since this is the minimum distance between voltage band centers along each of the two coordinates.

We now assume that the distortion in the voltage value of each cell, due to factors described in the Field and Background section above, has the characteristics of white (Gaussian) noise, and furthermore, that the respective distortions in the two cells are uncorrelated. Under these assumptions, the voltage level read values of a pair of cells that were programmed to levels represented by a point in the XY plane will fall within a circle of radius r around that point, e.g. circles 22, 24, 26 and 28 corresponding to points 14 to 20 above. In general, the voltage levels read for the pair of cells will not exactly coincide with their intended true values, are represented by the center of one of the circles, due to noise. However, the true values will almost always be represented by the closest circle center, and the probability that a wrong circle center will be closest is equal to the bit-failure rate in the single-cell case.

If each individual cell has 'm' bits per cell, then there are $2^m$ voltage bands, and there are $2^{2m}$ centers in the XY plane. These represent '2m' bits of information, as expected for two cells.

It is clear from FIG. 1 that the circles do not cover the entire voltage square $V_{max}^2$, and in fact cover only π/4 (ca. 79%) of it. Thus, in FIG. 1 the four quarters of circles 22, 24, 26 and 28 that reside in a square 30, cover only ca. 79% of square 30. It is also apparent that this arrangement of circles in the two-dimensional plane is not the most efficient to cover the plane, and that, for example, circles can be placed in a hexagonal grid to cover a larger percentage of the voltage window square.

Figure 2:
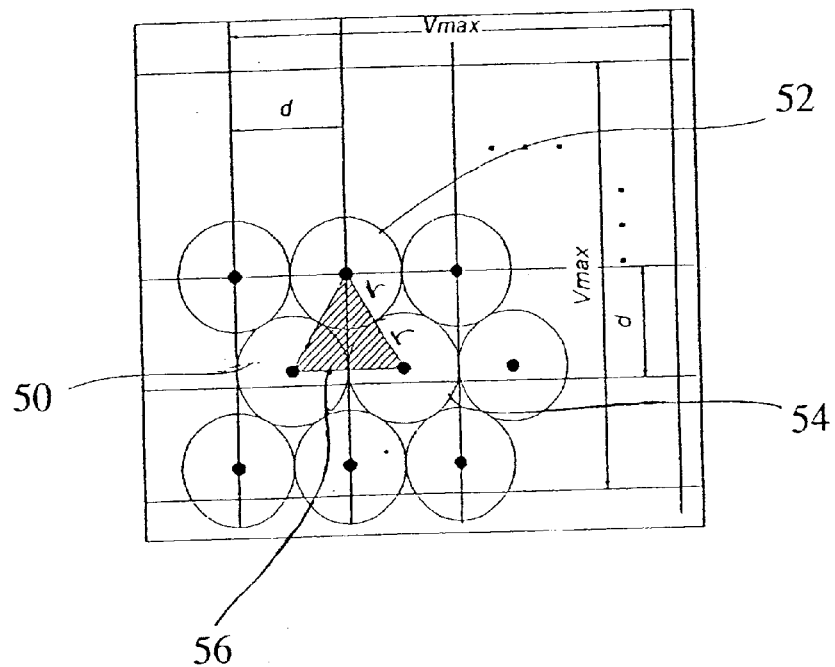
FIG. 2 is a schematic description of a two-dimensional optimal encoding scheme.

FIG. 2 shows such a hexagonal arrangement of circles (voltage level read points) having a higher packing density than FIG. 1. The percentage of a triangular area 50 covered by one sixth of each of circles 52, 54 and 56 is now ca. 90.69%. With this denser packing, more than $2^{2n}$ circles can now be placed in the same voltage window square. For example, a hypothetical packing of $2^{2n+1}$ such circles would enable, by suitable coding, the representation of '2m+1' bits of information in the combined two cells for a net gain of 1 data bit. Furthermore, since the circles are of radius r, any non-overlapping (in the geometric sense) packing of circles guarantees a distance of at least 2r between circle centers, and so the BRFR is equal to, or is better than that of the nominal BRFR for a single-cell case.

It should be noted that the two-dimensional representation of FIGS. 1 and 2 is for illustration purposes only, as in two dimensions there is not enough packing gain to achieve any information gain, and the packing of $2^{2n+1}$ circles mentioned yielding an extra information bit is not actually feasible in a two-dimensional plane. This extra information gain becomes feasible only in higher dimensions, which cannot be illustrated by a geometric drawing.

It is straightforward to generalize this n-dimensional space representation of n cell values to the case where more than two cells are coded collectively: when three cells are coded together, the voltage window is represented by a voltage cube in 3-dimensional space, and the voltage level read points are centers of spheres. These spheres can then be packed efficiently, much as oranges are packed in supermarket piles. If four or more cells are coded collectively, there is no direct geometric representation, but the problem of packing n-dimensional spheres in an n-dimensional cube is easily described mathematically, e.g in J. H.Conway and N. J. A. Sloane, "Sphere Packings, Lattices and Groups", Springer-Verlag 1999 (3$^{rd}$ edition).

The potential for improvement in information packing grows rapidly with increasing dimension. For example, while circles in the rectangular grid cover $\pi/4$ (ca. 79%) of the plane, spheres in a 3-dimensional space cover only $\pi/6$ (ca. 52%) of that space, 4-dimensional hyperspheres cover $\pi/32$ of (ca. 31%) of 4-dimensional space, and so on.

The mathematical problem of sphere packing in multi-dimensional space is a well-known and well-investigated problem and is described for example in Conway and Sloane. Note that while the sphere image is based on assumptions on the cell distortion behavior (i.e. Gaussian and uncorrelated between cells), this assumption is not essential to the present invention. A different noise behavior may result in a geometric image other than a sphere, but such a shape may also be packed in a more efficient manner than on a rectangular grid, resulting again in information packing gain.

To summarize, the voltage levels (cell values) are represented by center point positions arranged in an n-dimensional space, each center point being separated from its nearest neighbors by a distance equal to at least 2r.

Building a Code

The implementation of the present invention would typically require the design of a code that converts a sequence of data bits to voltage levels of a group of Flash cells.

Assume a Flash technology that encodes m bits per cell, so that there are $2^m$ voltage bands, each of at least 2r width, in a voltage window of width $V_{max}$. We consider a code that maps one of '$2^b$' vectors or 'b' bits collectively to n cells. Without any coding, these cells carry mn bits of information. We consider the problem of packing n-dimensional spheres each of radius r in an n-dimensional cube with side $V_{max}$.

If we are able to pack at least $2^b$ such spheres, then we are able to build a code that maps at least b bits of information to the sphere centers. And if a packing exists such that b>n×m there is a net information gain of b−nm information bits.

To summarize, the number is converted by an appropriate code (encoding scheme) to voltage levels that are mapped collectively to the center point positions arranged in the n-dimensional space by the operation described above.

In principle, any arbitrary one-to-one mapping will do, although practically, a mapping that is easy to compute will be chosen. The method thus involves a sphere packing arrangement, which is a static feature of the system, i.e. it is designed to achieve the target data gain, and is a constant during operation. The sphere packing is represented as a constellation of points (the sphere centers) in n-dimensional space, and is typically constructed using some error-correcting code as basis. The constellation and the basis code are not the same, though they are related due to mathematical factors, as explained for example in Conway and Sloane. Beyond the sphere packing construction, and quite separate from it, there is a one-to-one mapping between data (a group of bits) and a group of cell values, more exactly the points in the constellation (the coordinates of which are interpreted as cell values). This mapping is a dynamic feature of the system, as it is consulted or calculated on read (in one direction) and write (in the reverse direction). The sphere construction, including the algorithms, and the group mapping of data bits to cell values, as well as all other actions taken to write the number into the memory, are collectively referred to as "storing means".

Note that we are able to make use of fractional bits per cell, which cannot be used in normal MLC technology. For example, if under the target specification, 3 voltage bands fit within the voltage window, the Flash technology is better than single-bit-per-cell, but not good enough for 2-bit-per-cell MLC (which needs 4 voltage bands). However, by using the multi-cell coding we can easily take advantage of this 3 to 2 redundancy to gain information bits (asymptotically $\log_2(3/2)$ added bits per cell).

Designing the Flash

The method described in the present invention is advantageously compatible with any existing Flash silicon technology, and, as described above, leads to an increase in the capacity of existing technology. However, a preferred embodiment implementation of the method would typically require redesign of the Flash to enable the read and write of more levels per cell than are present in the original Flash silicon.

In writing to the Flash, each cell must be programmable to more levels than normally programmable in the original Flash silicon. For example, while regular single-bit-per-cell Flash technology has an electrical and programming interface that is able to program each cell to one of 2 levels (either 0'L or 1'L), an embodiment of the present invention would require an ability to write 3 or more levels The writing procedure would work in blocks of information bits. Each such block is encoded by the collective coding of bits to voltage levels of a group of Flash cells, and these levels are then preferably programmed (written) to the Flash cells using normal Flash programming techniques.

In reading the Flash, it is also necessary to have more resolution than typically existing in the original Flash. This is demonstrated by describing the reading mechanism: when the voltages of a group of n neighboring cells are read, they comprise an n dimensional vector. If the vector is imagined to be a point in n-dimensional space, each dimension represents a cell voltage level. Taking the sphere packing on which the code relies into consideration, it is determined which is the sphere center that is geometrically closest to this point. Having determined the closest sphere center, the block of information bits that corresponds to this center in the mapping is determined by decoding. The algorithms and procedures used for the retrieval of the bits from the memory (e.g. reading and decoding, as detailed below) are referred to as "retrieving means".

When reading each Flash cell voltage the voltage value is quantized to one of a set of discrete values. Therefore, the position of the cell group values (or its n-dimensional representation) in n-dimensional space contains a quantization error that adds to the indeterminacy of which sphere center is closest to each n-dimensional point representing the group value. To get good results, the read circuit of the Flash must have enough resolution so that the quantization error is small compared to the inherent Flash noise and distortion errors, and does not increase the nominal BRFR.

It should be appreciated that increasing the sensitivity of the read and write circuits of a Flash array can generally be done with logic serving the entire chip, so that the intrinsic Flash cell size is not affected (increased).

Implementation Using an Hamming Code

An exemplary application of the method of the present invention, referred to hereafter as the "main method", is now described. In this example, using single-bit-per-cell Flash, 20 bits of information are stored in 16 cells (instead of 16 bits in existing Flash), without increasing the nominal BRFR, for a net information gain of 25%.

We start from an original cell that has two voltage bands (i.e. one bit per cell), one signifying "0" and the other "1". According to our definition above, the centers of the bands are a distance of 2r from each other. We add a third voltage band midway between the original two, and call this level "1", while the original two levels are renamed "0" and "2". There are now three levels per cell, with the levels separated by a minimum distance of r, half of the original distance. Considering a block of 16 cells, there are $3^{16}$ distinct combinations of cell values, which may be represented as points on a 16-dimensional rectangular grid, embedded within a 16-dimensional hypercube whose side in each dimension is the size of the voltage window. It will be shown that at least $2^{20}$ non-overlapping (in the geometric sense) spheres (in 16-dimensional space), each of radius r, can be packed into the hypercube. Since the spheres do not overlap, the geometric distance between their centers is at least 2r, which is the distance that is required to maintain the original nominal BRFR.

As a basis for the construction of the sphere packing we use an Hamming code. A Hamming code is a type of error correcting code, described, e.g. in W. Wesley Peterson and E. J. Weldon, Jr., "Error-Correcting Codes", Second Edition 1972, MIT Press. Specifically we use the Hamming code H(15,11,3), whose code-words are of length 15, encoding 11 bits of information, and the Hamming minimum distance of the code is 3, meaning that any pair of code-words are different in at least 3 corresponding bit locations.

We extend the Hamming code-words by another bit by adding to each code word its parity bit, thus deriving an Hamming code (HEX), $H_{ex}(16,11,4)$. The code-words are now 16 bits each, and the Hamming distance is increased to 4 by the addition of the parity bit. This observation is explained by the fact that if in the original two code-words were different in exactly 3 bit locations, their parities were different, so the addition of a parity bit increases the distance to 4.

The spheres are now placed on the 16-dimensional space according to this code as follows: for each code-word in the Hamming code, a sphere is placed in the coordinates specified by the code-word bits, i.e. on the "0" or "1" level in each dimension according to the value of the corresponding bit. In addition, spheres are placed centered in all such positions where any "0" is replaced by "2". In other words, the coordinates of each sphere center is a code-word of the Hamming code, if all "2" coordinates are replaced by "0". A geometric distance of 2r separates any two sphere centers, because:

If one of the two centers has a "2" in an axis where the other has a "0", then there is a distance of 2r along this axis, so the total distance is equal or greater than 2r.

Otherwise, the coordinates of two centers differ in at least 4 places, the Hamming distance of the code. So the geometric distance between the centers is at least $\sqrt{4r^2}=2r$.

By enumerating the words and considering the permutations by which 0's in the code words may be replaced by 2's, it is easily shown that the construction yields more than $2^{20}$ spheres (see next section, Table 1). Therefore the location of a sphere can encode 20 bits of information.

To implement this scheme of encoding 20 bits to each sphere location, it is necessary to set up an encoding scheme (not to be confused with the used for the sphere construction) or "mapping" from a block of 20 information bits to a sphere center (represented as a block of 16 cell values). This mapping will be used to encode the information when writing to the memory, and to decode it when reading from the memory. The mapping is one-to-one and it goes in both directions: 20 bits to 16 cells when writing. 16 cells to 20 bits when reading.

When writing to the memory, information will be preferably grouped into 20 bits at a time. The mapping will be used to convert the grouped 20 bits to 16 cell values, the values being "0", "1" or "2". These values will then preferably be used to program the cells through conventional Flash programming means.

When reading the memory, cell values will preferably be read and quantized to digital values through conventional Flash reading means. As explained above, the resolution of the read value is chosen so that the quantization error does not significantly add to the error inherent in the Flash technology.

A group or "block" of 16 such cell values is read and considered collectively, and the sphere center corresponding to this "block" through the mapping procedure is identified. Essentially, this translates into the geometric problem of determining the closest sphere center, and it is algorithmically handled by the theory of Error Correcting Codes. The identified sphere center is then decoded to a block of 20 information bits, using the reverse of the mapping employed in programming/writing.

In principle, any mapping of information bits to sphere centers (representing 16 cell values) is suitable, and the mapping mechanism may be as simple as a direct lookup table (LUT). However, since such a table in this case would need $2^{20}$ entries, the mapping is preferably chosen in a way that enables a more compact implementation in software or firmware. Such a scheme is detailed in the following section.

A Practical Encoding and Decoding Method

This section describes a practical way of implementing the 16 cell to 20 bit mapping described in the previous section, using high-speed firmware or software.

We enumerate the words of the code $H_{ex}(16,11,4)$, sorting them into groups by their Hamming weight, which is defined as the number of 1's in the binary code-word. If the Hamming weight of a 16-bit code-word is w, the number of 0's in it is 16-w, and the number of different ways the 0's may be modified to 2's is $2^{16-w}$. Table 1 summarizes the results for this code. From Table 1 we observe that we need only code words of Hanmming weight up to 6 to encode 20 information bits. We will use only these code words for the construction. Notice that 541 code words (out of a total of $2^{11}=2048$) are required in order to distinguish the 20 bits or $2^{20}$ different spheres according to the following calculation: $1\times2^{16}+140\times2^{12}+400\times2^{10}=1,048,576=2^{20}$. Here the number of code words is 541=1+140+400.

TABLE 1

| Hamming Weight W(16-w) | code words | code word $2^{16-w}$ | Number of Sphere per Total number of spheres | Accumulated number of spheres | Accumulated number of bits |
|---|---|---|---|---|---|
| 0(16) | 1 | 65,536 | 65,536 | 65,536 | 16 |
| 4(12) | 140 | 4,096 | 573,440 | 638,976 | 19 |
| 6(10) | 448 | 1,024 | 458,752 | 1,097,728 | 20 |
| 8(8) | 870 | 256 | 222,720 | 1,320,448 | 20 |
| 10(6) | 448 | 64 | 28,672 | 1,349,120 | 20 |
| 12(4) | 140 | 16 | 2240 | 1,351,360 | 20 |
| 16(0) | 1 | 1 | 1 | 1,351,361 | 20 |

We use two lookup tables, one for encoding (write), the second for decoding (read). The encoding table contains the 541 code words of weight up to 6, sorted by Hamming weight (code-words with equal weights are in arbitrary order). The first 140 entries in the encoding table hold the code-words in the extended with Hamming weight 4, and the next 400 entries hold code-words in the extended with Hamming weight 6. The decoding table contains 2048 entries, one for each code-word, indexed by their (11-bit) information bits. This can be achieved since the , and thus also the , are systematic codes.

The table entry contains the origin of the $2^{20}$ range corresponding to that code word. Note that since only 541 code words are used, only 541 will contain meaningful information; the rest are either "don't-care" or signify a decoding error.

The encoding procedure works by calculating an index in the encoding table, using the fact that the table is sorted by increasing Hamming weight. The calculation yields an index and a "remainder" or offset for that entry. The offset bits are then used to decide which 0's in the code-word will be modified to 2's. This is described below in pseudo code:

The encoding procedure receives as input a number N of 20 bits. Denote bit 'k' of the binary representation of N as N(k).

If($N<2^{16}$)//Hamming weight is 0
   TableOffset←0;
   CellOffset←N
Elseif($N<[2^{16}+140\times2^{12}]$),//Hamming weight is 4
   $N_1$←$N-2^{16}$; TableOffset←$N_1$[bits 19:12]+1;
   CellOffset←$N_1$[bits 11:0]
else, //Hamming weight is 6
   $N_1$←$N-2^{16}-140\times2^{12}$; TableOffset←$N_1$[bits 19:10]+141;
   CellOffset←$N_1$[bits 9:0]
end
Code-word←Table[TableOffset];
j←0;
for k∈{0,1, . . . ,15},
If {Code-word(k)=0}, Cell(k)←CellOffset(j)×2;j=j+1
   else, Cell(k)←Code-word(k); end
end The following describes the decoding procedure. Decoding receives as input a vector C of 16 values of each corresponding cell voltage. Denote the cell 'k' voltage level read as C(k).

1. Read each of 16 cells, and derive C(k), D(k), E(k) for each cell:
   for k∈{0,1, . . . ,15},
     C(k) is the (possibly fractional, or "soft") cell level.
     D(k)=1 if the closest integer to C(k) is 2, otherwise D(k)=0
     E(k)=C(k)−2D(k)//converts '2's to '0's
   end
2. Perform Maximum Likelihood decoding on the soft Hamming input E(k) to get Code-word.
3. Calculate information code offset by converting the D(k) to a number (this is the reverse of the last step of the encoding scheme):

```
Offset←0; Acc←1;
for k∈{0,1,...,15},
    if {Code-word(k)=0},
        if(D(k)=1), Offset ← Offset + Acc; endif;
        Acc←Acc×2;
    end
end
```

4. Perform translation to 20-bit information value N:
   InfoIdx←Code-word[bits 0:10]; //first 11 bits of code word are information bits
   N←DecTable[InfoIdx]+offset; //add offset to origin for this code word to get N The maximum likelihood decoding of step 2 above is an algorithm to find the geometrically closest center in the sphere packing arrangement to the point represented by the group of cell values read. Various algorithms for performing maximum likelihood decoding are described in the art, e.g. the Viterbi algorithm as described in A. Vardy, "Trellis Structure of Codes", Coordinated Science Library, University of Illinois at Urbana-Champaign, 1998.

Higher-Order Hamming Codes

The method detailed above using s, which has been demonstrated on codes for 16 cells, with an information gain of 25%, is directly applicable to higher order s for 32, 64, 128 etc. cells. For higher orders, the proportional information gain increases regularly and can be shown to reach a limit of around 58%.

To demonstrate this, consider that there are Hamming Codes for blocks whose length is a power of 2: $H_{ex}(2^m, 2^m-m-1, 4)$ and $n=2^m$. The check matrix for this code is $2^m \times (m+1)$, so that the syndrome has (m+1) bits. A co-set of the code is defined as the set of words with a given syndrome. The set of code-words is the co-set whose syndrome is comprised of all zeroes, and any other co-set is a translation of the code-word set by some fixed bit vector (by translation we mean a bitwise addition modulo 2, or a bitwise XOR operation).

From the construction of the sphere arrangement given above by example for 'n=16', it is apparent that not only the , but also any of its co-sets, could serve as a basis for the sphere packing construction. Co-set based sphere packing construction arrangements may yield a different number of spheres (because of the difference in the ways 0's can be modified to 2's in the co-set words). However, since:

The total number of points in the n-dimensional voltage space is $3^n$.
   The number of distinct co-sets is equal to the number of possible syndromes, which is $2^{m+1}$
   Each point is a center in the sphere construction for one, and only one, co-set.
   For at least one co-set, the sphere construction has more sphere centers than the average for the sphere constructions for all co-sets.

Therefore, there is a sphere construction with at least $3^n/2^{m+1}$ spheres. The number of information bits this construction is able to represent is the integer part of $\log_2(3^n/2^{m+1})=n \log_2 3-m-1$. Remembering that the original information content of the n cells was 'n' information bits, the proportional gain is $\log_2 3-(m-1)/n$, which (as $n=2^m$) increases monotonically with a limit of $\log_2 3=1.58496$ . . . as n→∞. Therefore, 58% information can be gained through the construction. A gain of 50% is attainable for $n \geq 128$.

A Simplified Implementation

A simplified implementation, which avoids some of the complexities of the main method described above, is to define in each cell more levels than signal-to-noise allows, and to consider cells in groups, where each group includes redundancy cells. If enough redundancy cells are added, it is possible to extract information with the required nominal BRFR by coding the information with an Error Correcting Code. Basically, this simplified method consists of overloading the information in each cell, and using redundancy and error correcting codes to retrieve information reliably. The advantage of this simplified implementation is in its ease of application and use. However, the information gain available through it is significantly lower than that available through the main method.

Other Constructions

Even better results of increased information gain provided by the method of the present invention can be achieved by using other codes as basis for the sphere construction, and by subdividing the voltage window into more than 3 discrete levels.

The method above presumed single-bit-per-cell Flash as a base technology. Similar techniques are applicable when using Flash technology with true multi-level cell capability, in which case a preferred embodiment of the method of this invention subdivides the voltage window into more levels than the inherent (nominal) multi-level cell capability allows, and improves overall information content by encoding several cells at a time. Known results in the theory of sphere packing suggest that the potential information gain obtainable through the application of this invention grows without limit, albeit slowly (in a logarithmic rate) with increasing size of the cell group.

Application to other storage technologies

From the description given it is apparent that the method of the present invention is applicable not only to Flash technology, but to any digital storage technology where:

The information is stored in units of analog quantities.

These analog quantities are quantized to discrete digital values.

The number of distinguishable digital values is limited by the signal-to-noise ratio.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made.

What is claimed is:

1. A method for storing and retrieving a binary number including b data bits, comprising the steps of:
   a) providing a memory including a number n, greater than 1, of cells, each said cell having a respective adjustable parameter; and
   b) setting said parameters to collectively represent the number.

2. The method of claim 1, further comprising the steps of:
   c) measuring said parameters; and
   d) decoding said measured parameters collectively to recover the number.

3. The method of claim 2, wherein said memory is a solid state memory, and wherein said parameters are voltages.

4. The method of claim 3, wherein said solid state memory is a flash memory.

5. The method of claim 4, wherein each said parameter is adjustable within a number p, greater than 1, of distinct bands.

6. The method of claim 5, wherein said memory is a single-bit-per-cell memory, and wherein said p is at least 3.

7. The method of claim 5, wherein said memory is a multi-bit-per-cell memory, and wherein said p is at least 5.

8. The method of claim 2, wherein said setting further includes the steps of:
   i) representing said parameters by center point positions arranged in an N-dimensional space, each said center point being separated from its nearest neighbors in said N-dimensional space by a distance equal to at least 2r; and
   ii) mapping the number to said center point positions using an appropriate encoding scheme.

9. The method of claim 8, wherein said arrangement of center point positions is based on an error correcting code.

10. The method of claim 9, wherein said code is an extended Hamming code.

11. A method for storing and retrieving a binary number including b data bits in a nominal m-bit per cell memory technology having a nominal bit read failure, m being at least 1, the method comprising the steps of:
    a) providing a plurality n<b/m of cells;
    b) assigning each said cell at least $2^m+1$ adjustable parameter values; and
    c) setting said parameter values to collectively represent the number, whereby the nominal bit read failure rate is preserved.

12. The method of claim 11, further comprising the steps of:
    d) measuring said parameter values; and
    e) collectively decoding said measured parameter values to recover the number.

13. The method of claim 12, wherein said memory is a solid state memory, and wherein said parameter values are voltage values.

14. The method of claim 12, wherein said solid state memory is a flash memory.

15. The method of claim 12, wherein said collective encoding further includes the steps of:
    i) arranging in an N-dimensional space center point positions representing respectively said parameter values, each said center point being separated from its nearest neighbors in said N-dimensional space by a distance equal to at least 2r; and
    ii) mapping the number to said center point positions using an appropriate encoding scheme.

16. The method of claim 15, wherein said arranging is based on an error correcting code.

17. The method of claim 16, wherein said code is an extended Hamming code.

18. A storage device for storing a binary number of b bits, the device comprising:
    a) a memory having a plurality n of nominal m-bit-per cell cells, n being smaller than b/m;
    b) a plurality of adjustable parameters used to represent the bits;
    c) storing means to collectively set said adjustable parameters to store the number in said memory; and
    d) retrieving means to collectively measure said parameters to retrieve said number from said memory.

19. The device of claim 18, wherein said memory is a solid state memory, and wherein said adjustable parameters are voltages.

20. The device of claim 19, wherein said solid state memory is a Flash memory.

* * * * *